US008411447B2

(12) United States Patent
Turner

(10) Patent No.: US 8,411,447 B2
(45) Date of Patent: Apr. 2, 2013

(54) POWER AMPLIFIER CHASSIS

(75) Inventor: Stephen D. Turner, State College, PA (US)

(73) Assignee: Teledyne Paradise Datacom, LLC, Thousand Oaks, CA (US)

( * ) Notice: Subject to any disclaimer, the term of this patent is extended or adjusted under 35 U.S.C. 154(b) by 538 days.

(21) Appl. No.: 12/642,160

(22) Filed: Dec. 18, 2009

(65) Prior Publication Data

US 2011/0149526 A1 Jun. 23, 2011

(51) Int. Cl.
*H05K 5/00* (2006.01)
(52) U.S. Cl. ......... 361/730; 361/752; 361/800; 361/753
(58) Field of Classification Search .................. 361/730, 361/800
See application file for complete search history.

(56) References Cited

U.S. PATENT DOCUMENTS

| | | | |
|---|---|---|---|
| 5,200,685 A * | 4/1993 | Sakamoto | 320/103 |
| 5,280,625 A | 1/1994 | Howarter et al. | |
| 6,549,405 B2 | 4/2003 | Wharton et al. | |
| 6,879,627 B1 | 4/2005 | Davidson et al. | |
| 6,943,625 B2 | 9/2005 | Lane et al. | |
| 7,187,926 B1 | 3/2007 | Henkel | |
| 7,382,185 B1 | 6/2008 | Sternowski | |
| 7,463,707 B2 | 12/2008 | Dale et al. | |
| 7,525,396 B2 | 4/2009 | He et al. | |
| 2003/0223209 A1 * | 12/2003 | Lee | 361/796 |
| 2004/0036995 A1 * | 2/2004 | Suzuki et al. | 360/69 |
| 2004/0120132 A1 * | 6/2004 | Kooker et al. | 361/818 |
| 2005/0089027 A1 * | 4/2005 | Colton | 370/380 |
| 2005/0152301 A1 | 7/2005 | Bettinger et al. | |
| 2005/0195075 A1 * | 9/2005 | McGraw et al. | 340/500 |
| 2006/0270451 A1 | 11/2006 | Best et al. | |
| 2007/0019605 A1 | 1/2007 | Rioux et al. | |
| 2007/0139104 A1 | 6/2007 | Yuan | |
| 2007/0233781 A1 * | 10/2007 | Starr et al. | 709/203 |
| 2007/0234118 A1 * | 10/2007 | Sardella et al. | 714/23 |
| 2008/0030947 A1 * | 2/2008 | Behrens et al. | 361/686 |
| 2008/0133687 A1 * | 6/2008 | Fok et al. | 709/207 |

* cited by examiner

*Primary Examiner* — Tuan T Dinh
*Assistant Examiner* — Steven Sawyer
(74) *Attorney, Agent, or Firm* — McNees Wallace & Nurick LLC

(57) ABSTRACT

A power amplifier chassis for an n+1 redundant power amplifier system. The power amplifier chassis includes an embedded controller and a power amplifier. The embedded controller operates the power amplifier chassis in a master controller mode or a slave controller mode. When operated in the master controller mode, the embedded controller monitors operating parameters associated with the power amplifier chassis, and can transfer control of the power amplifier system when the embedded controller senses that the monitored operating parameters indicate a failure or impending failure of the power amplifier chassis. When operated in the slave controller mode, the embedded controller receives control instructions from the master controller power amplifier module, and is enabled to reconfigure the power amplifier chassis from the slave controller mode to the master controller mode in response to a failure or imminent failure indication of a first power amplifier chassis operated in master controller mode.

17 Claims, 11 Drawing Sheets

POWER AMPLIFIER CHASSIS

CROSS-REFERENCE TO RELATED PATENT APPLICATIONS

The subject matter of this application is related to U.S. patent application Ser. No. 12/641,967, now U.S. Pat. No. 8,189,338 filed on even date herewith, and entitled "POWER AMPLIFIER SYSTEM"; the disclosure of which is hereby incorporated by reference.

BACKGROUND

The application generally relates to a power amplifier chassis. The application relates more specifically to a power amplifier chassis for use in a modular power amplifier system with fault tolerant redundancy.

Currently, a power amplifier system may be designed to have little or no excess capacity or duplicated components for fail-safe protection, also referred to as redundancy. Other power amplifier system designs may include a single-chassis redundancy, while still other designs may include multiple, or "n"-chassis which incorporate a degree of unswitched, n+1 redundancy and are controlled by a single controller.

A single amplifier chassis with no redundancy may be used to implement a redundant power amplification system. Such a system provides limited options for performing routing field maintenance or repairs, and must be used with a switch to provide one-to-one, or one-to-two amplifier configurations. The switch in a redundant single-amplifier chassis system is an additional active device that may potentially fail. Also, the single amplifier chassis system must be interrupted during switch engagement. The output power of a single amplifier chassis system is limited to what can be achieved in a single chassis.

In a power amplifier system with a combined chassis or single-chassis redundancy system, two power amplifiers, each of which is capable of driving the full output load, are configured in parallel operation. The combination of the parallel amplifiers have double the output power capability of a single chassis amplifier, although only half of the total output power capability is used at any one time. The single chassis redundancy option does not provide n+1 redundancy, and may include several potential points of failure, e.g., switches, embedded controllers, etc.

In a single amplifier chassis with multiple modules, e.g., an 8-amplifier module, some redundancy may be realized. A slightly higher power level is available in traditional single chassis amplifiers. Single chassis with eight individual amplifier modules provides the amplifier with a limited degree of n+1 redundancy that is switchless. The failure of (1) out of (8) modules results in a loss of 1.5 dB of output power so the system can be used as a "self-contained" redundant system. However, a traditional single chassis amplifier includes just a single embedded controller that may potentially be a point of failure. Further the traditional single chassis amplifier can only be configured with (8) modules, so the system cannot be scaled, i.e., field modified to increase the system capacity.

The existing power amplifier systems are characterized by a large chassis comprising multiple, e.g., 8 physically small, low power amplifier modules, wherein the large chassis is not easily removable, and cannot be removed without shutting down the system. The present application discloses a single small chassis with a physically large, high power, removable amplifier module that may be removed during system operation without an interruption of service.

Thus there is a need for a power amplifier chassis in a modular power amplifier system that includes an embedded controller, and that can be operated as a master or a slave amplifier chassis in a modular power amplifier system. Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment is directed to a power amplifier chassis for an n+1 redundant power amplifier system. The power amplifier chassis includes a power amplifier chassis comprising an embedded controller and a power amplifier. The embedded controller is configured to operate the power amplifier chassis in a master controller mode or a slave controller mode. If the power amplifier chassis is operated in the master controller mode, the embedded controller monitors at least one operating parameter associated with the power amplifier chassis. The embedded controller is configured to transfer control of the power amplifier system in response to the embedded controller sensing that at least one of the monitored operating parameters indicates a failure or impending failure of the power amplifier chassis. If the power amplifier chassis is operated in the slave controller mode, the embedded controller is configured to receive control instructions from the master controller power amplifier module, and to reconfigure the power amplifier chassis from the slave controller mode to the master controller mode in response to a failure or imminent failure indication of a first power amplifier chassis operated in master controller mode.

Certain advantages of the embodiments described herein are embedded control within each power amplifier module for complete parallel redundancy of the monitor and control functions, and a multiple chassis cabinet that allows a higher-power amplifier module to be integrated into chassis.

Another advantage is that the power amplifier chassis may be disconnected from a multiple chassis system without the necessity and associated inconvenience of disconnecting all of the cabling and waveguide connected at the rear of the chassis, and can removed from the system cabinet, e.g., for returning the power amplifier chassis to the factory for repair.

Alternative exemplary embodiments relate to other features and combinations of features as may be generally recited in the claims.

BRIEF DESCRIPTION OF THE FIGURES

FIG. 8A illustrates a sectional view of the solid state power amplifier chassis taken along the lines 8A-8A in FIG. 8

DETAILED DESCRIPTION OF THE EXEMPLARY EMBODIMENTS

A modular power amplifier system 10 (FIG. 1) disclosed herein may be employed in communication systems, in particular satellite communications system, to provide a large degree of output power redundancy and field maintainability which are lacking in traditional amplifier systems. In one aspect the redundancy is achieved through the parallel system microwave power combining RF (Radio Frequency) output power from the modular power amplifier system 10 is achieved at a high level that is provided through multiple power components operating at a lower power level . . . . The lower power component is a single amplifier module or chassis. As disclosed in greater detail below, the failure of one amplifier of the multiple component system results in a lesser degree of total output power reduction, allowing the system to continue in operation at a lower output power level without interruption. This capacity increase is referred to as n+1 redundancy.

Figure 1:
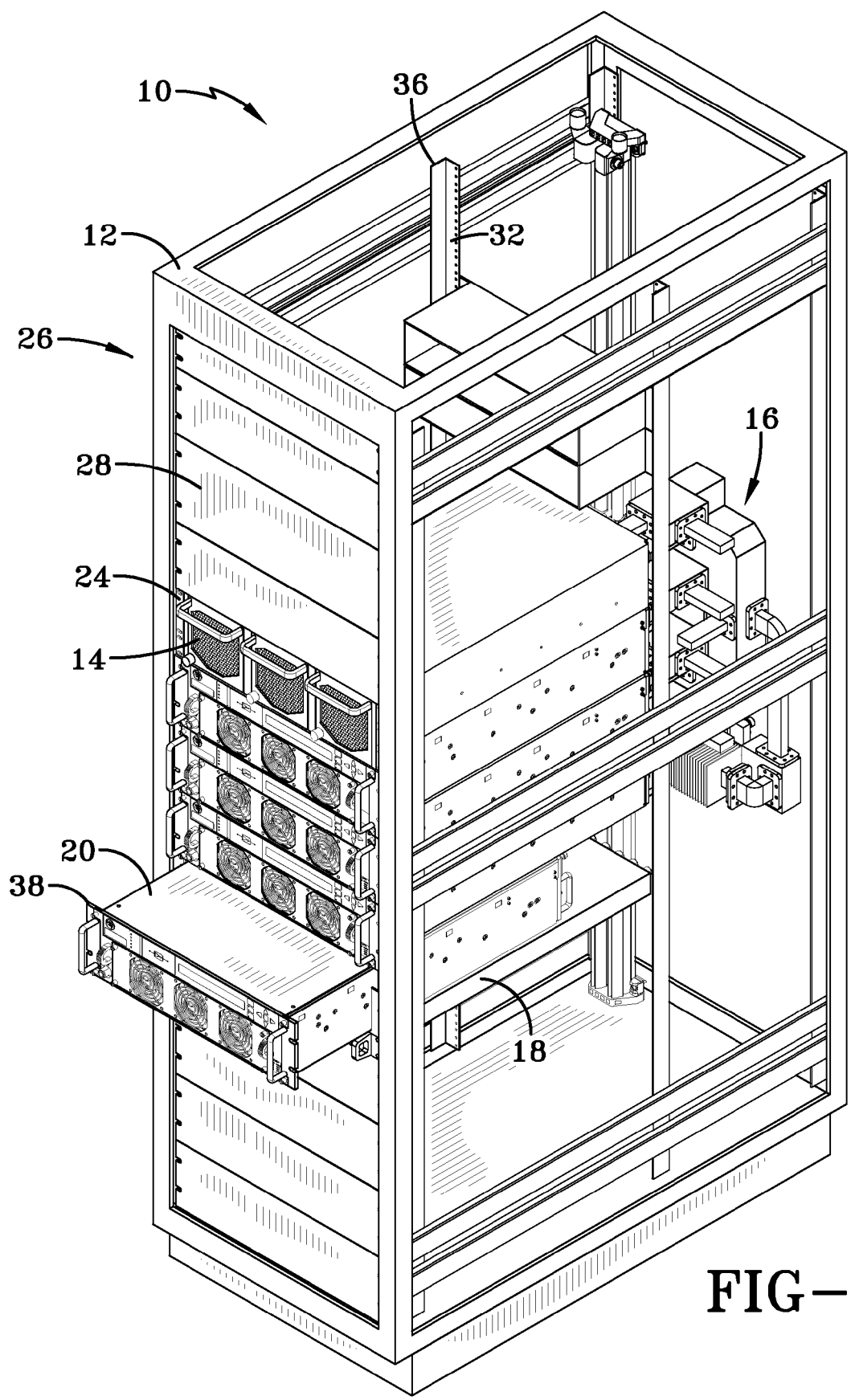
FIG. 1 illustrates a front perspective view of an exemplary modular power amplifier system having four amplifier chassis mounted thereon.
Figure 2:
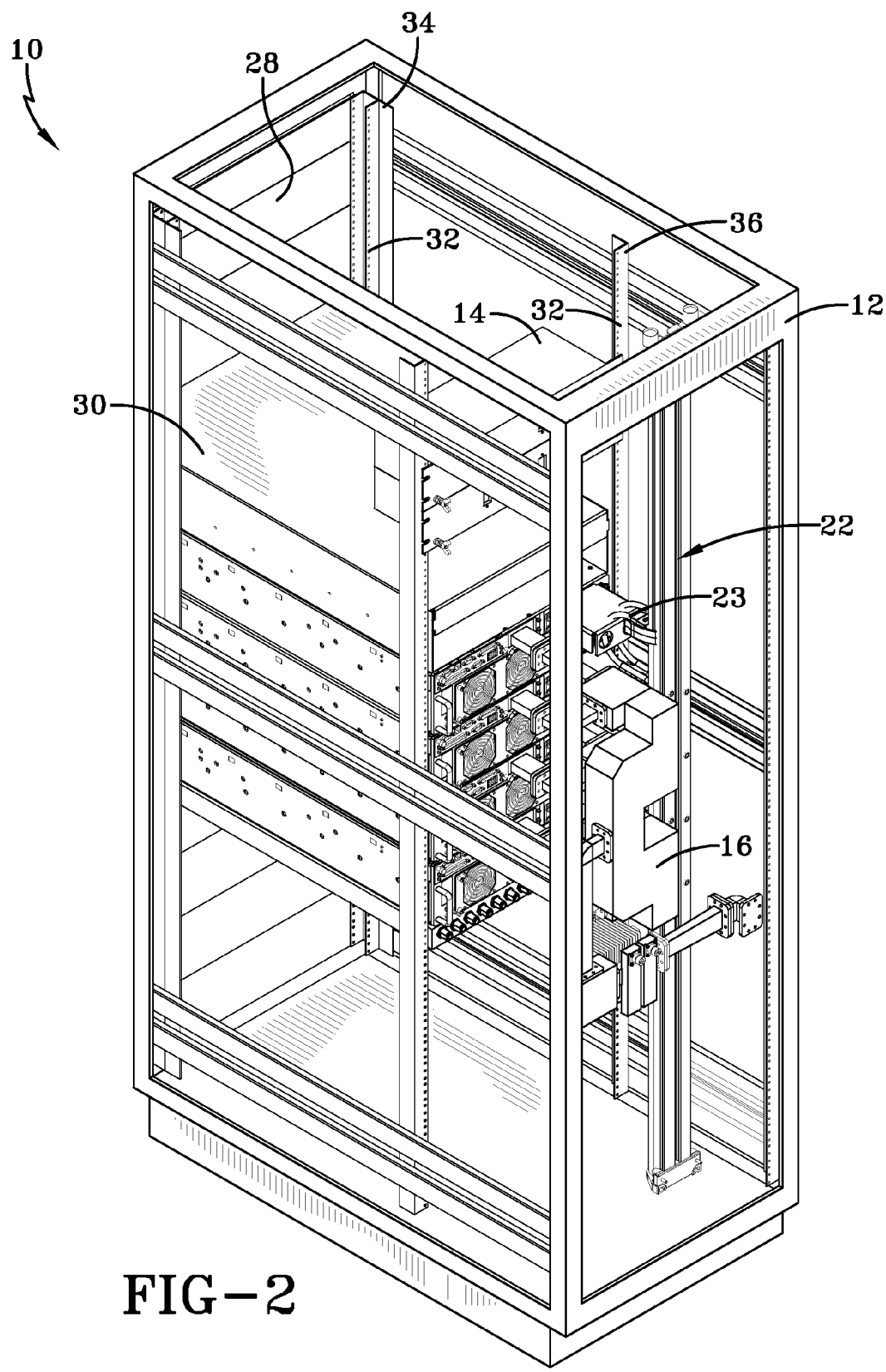
FIG. 2 illustrates a rear perspective view of the modular power amplifier system of FIG. 1.

Referring to FIGS. 1 and 2, one embodiment of a modular power amplifier system 10 includes a cabinet 12 capable of accommodating up to eight power amplifier chassis 20, an RF distribution panel 18, a waveguide combiner 16, and a redundant power supply 14. In the exemplary embodiment shown in FIGS. 1 and 2, only four power amplifier chassis 20 are installed in cabinet 12. Cabinet 12 may be arranged with any number of power amplifier chassis 20 between two and eight. In alternate embodiments, an individual cabinet 12 may be designed to accept a maximum of more or less than eight power amplifier chassis 20, depending on the application. In another exemplary embodiment (shown in FIGS. 3 and 4), two cabinets 12 may be coupled through a waveguide combiner 16 to bring the capacity of a modular power amplifier system 10 up to sixteen (2×8) amplifier chassis 20. Each power amplifier chassis 20 includes a solid state power amplifier (SSPA) module 100 (FIG. 9) as a sub-unit of chassis 20. The terms power amplifier chassis 20 and SSPA module 100 may be used interchangeably in this specification.

Cabinet 12 includes a power rail assembly 22 extending vertically adjacent the rear of cabinet 12. Power rail assembly 22 is preferably insulated and includes longitudinal slots in the insulating layer (not shown) for receiving terminals of power cables 23 into electrical contact with the internal power conductors of power rail assembly 22. Power cables 23 connect internal power busses (see, e.g., FIG. 9) in the power amplifier module 20 to power rail assembly 22.

The RF distribution panel 18 receives an RF input signal (FIG. 9) from a signal source, e.g., a satellite modem (not shown) and divides the RF input signal two ways for distribution to power amplifier modules 20. For a configuration of four power amplifier modules, RF inputs are divided into two input paths, which are then further split into two more input paths to divide the original RF input signal from the signal source into four approximately equal RF amplifier input signals. The four power amplifier modules 20 process the RF input signals, and the processed RF signals are combined in the reverse manner as described above by the waveguide combiner 16 to provide RF output at a very high level from a plurality of lower power level components. In modular power amplifier system 10, power is combined passively, i.e., no switching is used, thus the RF output power is never interrupted due to a failure of a switching device. Modular power amplifier system 10 may be employed as a "self-redundant" system. The output power is sized such that the loss of a single power amplifier chassis 20 will allow the system to maintain its minimum required output power. This type of system architecture is described as n+1 redundant. System 10 may be configured with any number of parallel power amplifier modules 20. Preferably system 10 may include binary combinations of 4, 8, or 16 modules. A more detailed discussion of the waveguide combiner 16 and amplifier operation is set forth below.

Each power amplifier chassis 20 mounts in cabinet 12 through a front access panel 26. Front access panel 26 includes a plurality of separately removable cover plates 28. Each power amplifier chassis 20 is slidably insertable and removable in a slot by removing one or more of the cover plates 28. For vertical alignment of power amplifier chassis 20, side rails 30 mate with teeth 32 in forward and rear vertical rails 34, 36, respectively, of cabinet 12. Power amplifier chassis 20 also includes flange portions 38 on either side of front panel 58 (see FIG. 6), for fastening power amplifier chassis 20 to cabinet 12.

Each power amplifier chassis 20 includes an embedded controller or microprocessor 101 (FIG. 9) for complete parallel redundancy of the monitor and control functions. If a failure occurs within an amplifier chassis 20, the next amplifier chassis 20 in the system hierarchy will assume control as the "master" controller. The transfer of control is accomplished by the communication/alarm bus 150. (see FIG. 9) Therefore remote control as well as local control is maintained without interruption.

Figure 9:
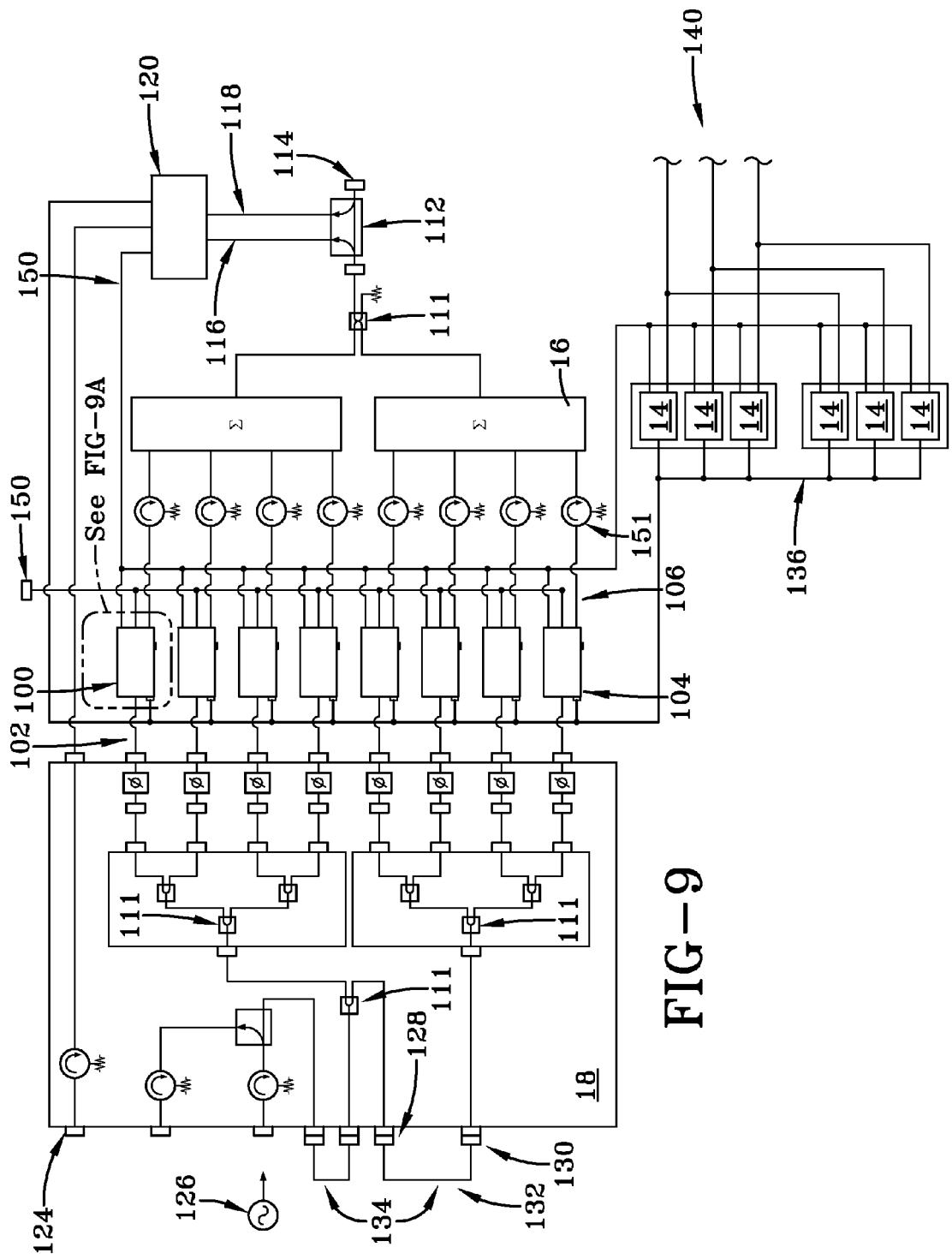
FIG. 9 is a schematic block diagram of an exemplary solid state power amplifier.
Figure 9A:
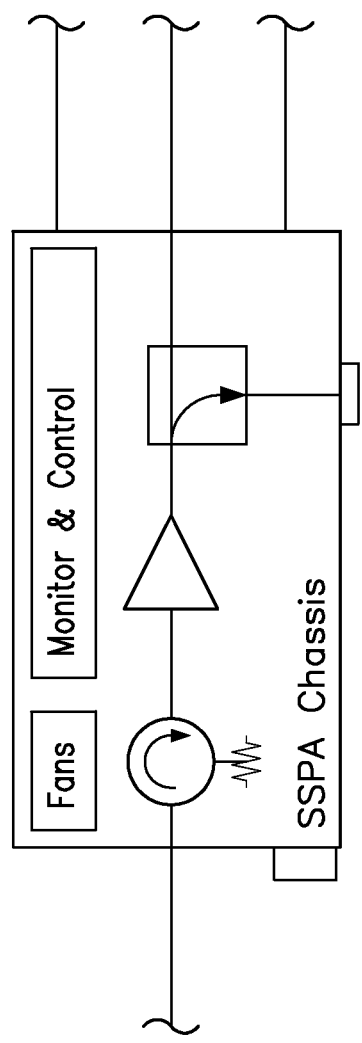

Further, multiple chassis 20 allow a higher power amplifier 110 (FIG. 9) to be integrated into chassis 20. An individual amplifier chassis 20 has greater power density as well as physical space for air cooling components contained within amplifier chassis 20, than a single chassis device with multiple amplifiers (FIG. 9). For example, the present output power limitation of a single chassis amplifier at C Band may be 1500 watts (W) because all of the power amplifiers reside within the confined volume of a single chassis. By contrast, the modular power amplifier system 10 having multiple chassis, e.g., two to sixteen modules, is capable of power levels in excess of 5000 W because each chassis or chassis 20 houses a single power amplifier 110 (FIG. 9). In addition, the use of multiple Power amplifier modules 20 allows a user to incrementally scale the deployment of system 10. I.e., the user may begin with two amplifier chassis 20 mounted in cabinet 12, and at a later time or times increase system 10 capacity to four, eight or sixteen chassis 20. External waveguide combiner hardware is external to chassis 20, which allows the waveguide combiner components to be field modified by the user.

RF distribution panel 18 provides splitters 111 (see FIG. 9) for dividing a main RF input signal 126 (FIG. 9) equally into low power signal components and distributing the low power signals to each of the power amplifier chassis 20 inputs. System 10 can include any integer number of amplifier chassis 20 between two and sixteen. An embedded microprocessor 101 in each of the power amplifier chassis 20 includes logic controls configured to automatically assign one of the amplifier chassis 20 to assume the role of a master controller, with the remaining power amplifier chassis 20 being slave devices. Each of the amplifier chassis 20 includes a light emitting diode (LED). The LED on the amplifier chassis 20 that is functioning as the master controller power amplifier chassis 20 will be illuminated to identify which of the amplifier chassis 20 is currently operating as the master controller. On the front panel 58 of each power amplifier chassis 20 a liquid crystal display (LCD) 46 will also clearly identify the master controller. The distributed controller arrangement allows system 10 to operate the array of amplifier chassis 20 as a single amplifier chassis. Each of the embedded microprocessors 101 includes logic for transferring control of system 10 to another amplifier chassis 20 if the master amplifier chassis 20 fails.

Figure 3:
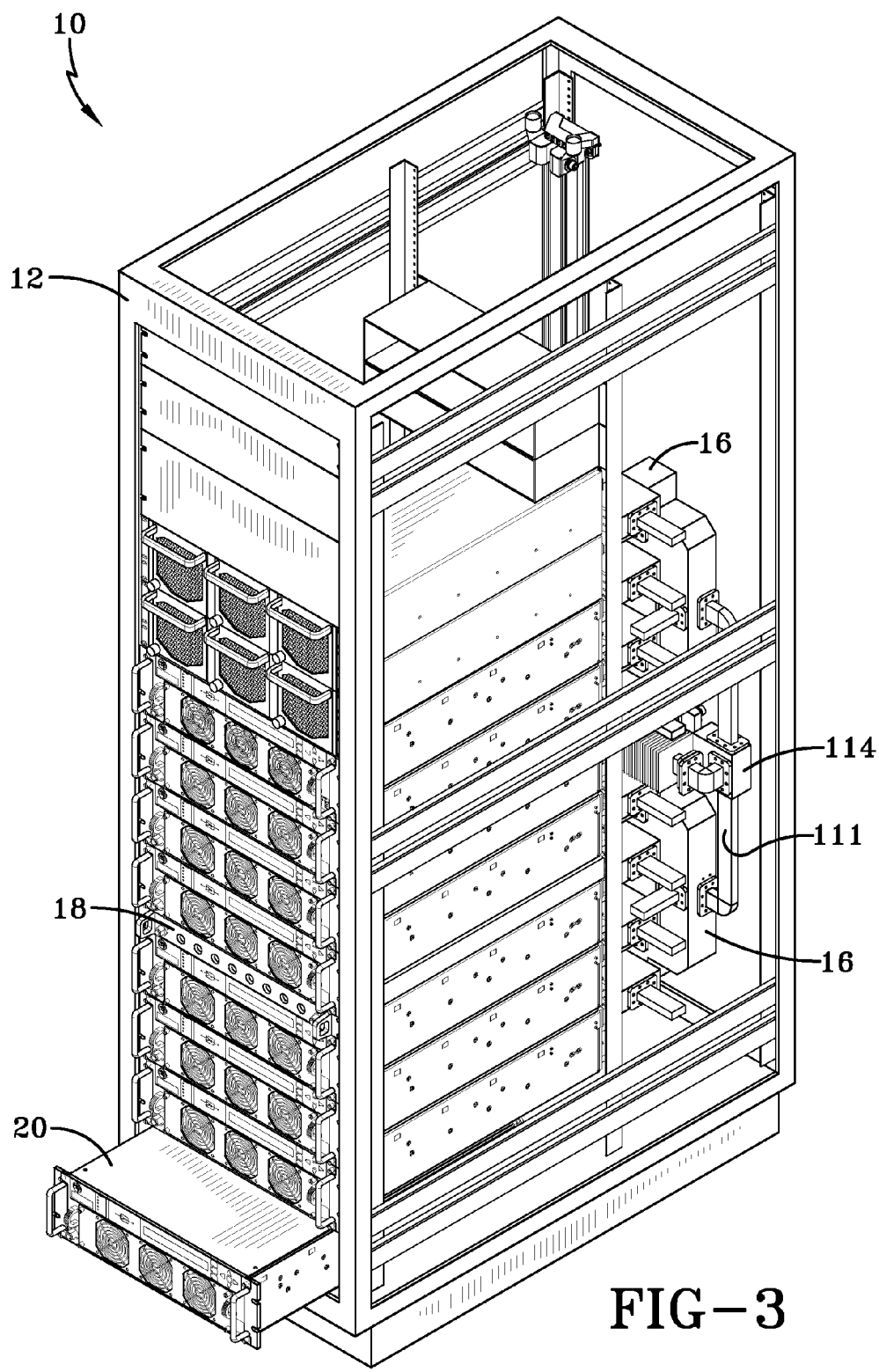
FIG. 3 illustrates a front perspective view of an exemplary modular power amplifier system having eight amplifier chassis mounted thereon.
Figure 4:
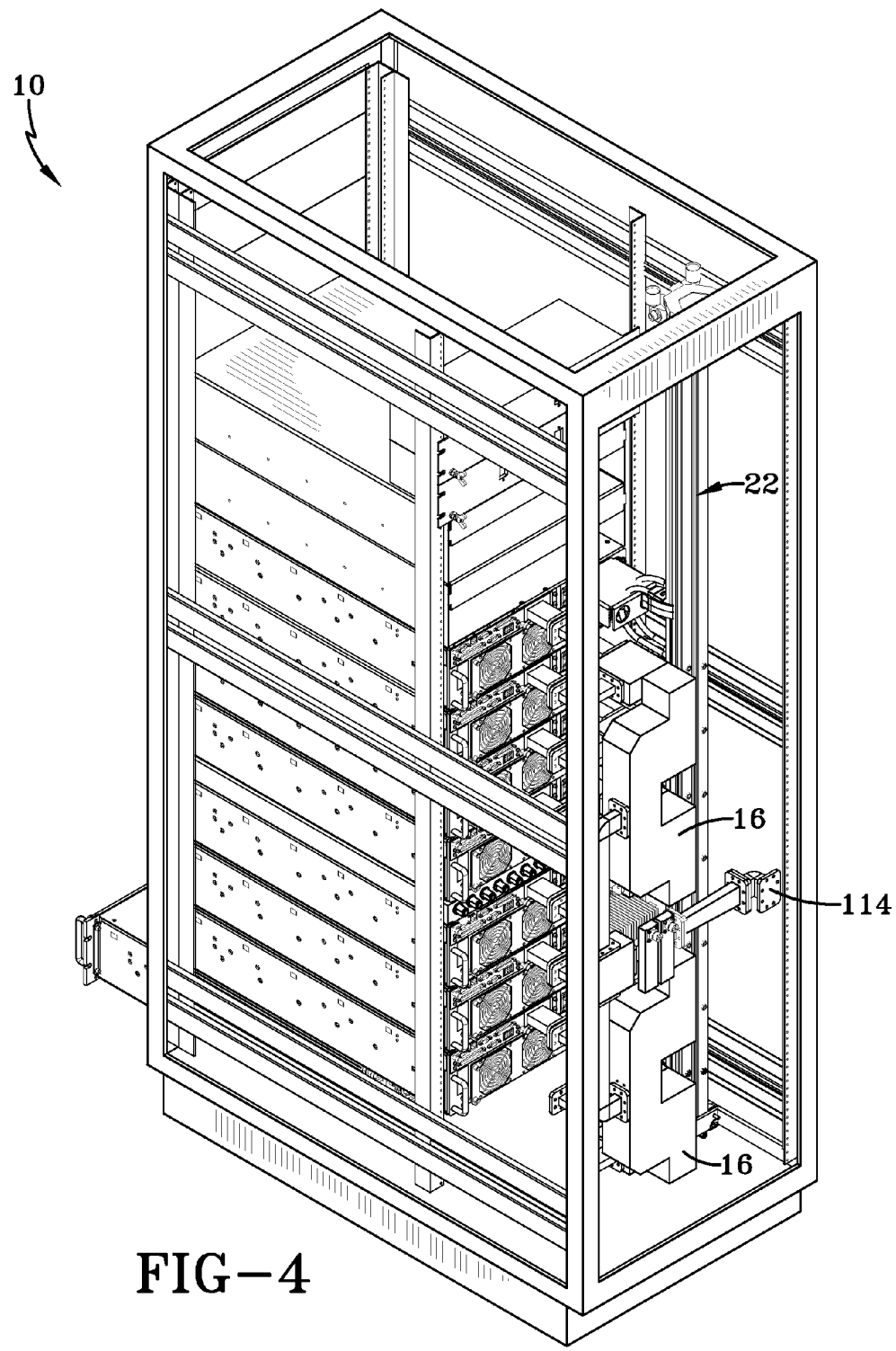
FIG. 4 illustrates a rear perspective view of the modular power amplifier system of FIG. 3.

Referring to FIGS. 3 and 4, an exemplary modular power amplifier system 12 has eight amplifier chassis 20 mounted in cabinet 12. FIG. 4 illustrates a rear perspective view of the eight-amplifier modular power amplifier system 10. A pair of 4-way waveguide combiners 16 are connected with a 2-way waveguide combiner 111 such that a set of eight amplifiers chassis are combined into a single RF output port 114.

Each of embedded microprocessors or controllers 101 may be configured to monitor multiple parameters of power amplifier chassis 20 that are indicative of an amplifier failure, e.g., internal temperatures, power and current inputs and outputs, unbalanced loads, etc. In response to a failure indication, embedded microprocessor 101 transfers master control of system 10 to one of the remaining power amplifier chassis 20 and clears itself from system 10. Master control may be transferred to the adjacent power amplifier chassis 20 in the system. Alternately, any of the remaining power amplifier chassis 20 may be designated master controller, e.g., according to a numerical sequence, randomly, etc. Once the control is transferred to a second power amplifier chassis 20, the newly designated master control power amplifier chassis 20 remains the master controller until the failed power amplifier chassis 20 has been repaired or replaced, or until a failure indicator requires a transfer to a third power amplifier chassis 20 or in the case of a two-module system 10, a transfer back to the first power amplifier chassis 20.

When a failure/alarm condition occurs within a given SSPA chassis, the system will initiate a minor alarm condition. The minor alarm condition is reported both locally, on the front panel of the Master SSPA Chassis, as well as remotely via the Ethernet interface. The minor alarm condition does not impair system operation just simply notifies the user that a fault has occurred in that give SSPA chassis.

An embedded controller 101 in each SSPA amplifier module 100 monitors all functions of the n+1 redundant system via communication/alarm bus 150 (see FIG. 9). Communication/alarm bus 150 allows the remaining controllers to adjust the gain level of the remaining amplifier modules 20 to keep the overall system gain equal to the system gain when all eight SSPA modules 100 are active. This portion of the system fault tolerance equalizes the system gain in the presence of a failure therefore causing no system level changes to the satellite modem or frequency converters that are feeding a signal into the amplifier system 10.

Embedded controller 101 monitors overall system output power from power measurement module 120. System output power and reflected power are monitored by the embedded controller network and displayed on front panel 42 of the master amplifier chassis 20 and by remote control, e.g., via an Ethernet port. The flexibility of embedded controller 101 is such that any amplifier chassis 20 may be removed from cabinet 12 and used as a stand-alone amplifier chassis 20.

Each power amplifier chassis 20 may be disengaged during operation of system 10, i.e., while "hot", repaired and/or replaced with another or a repaired power amplifier chassis 20. Since system 10 is sized with n+1 power amplifier modules 20, the loss of a single power amplifier chassis 20 from system 10 does not impact performance. Additional power amplifier chassis 20 may be disengaged from system 10 during operation, which may result in a decrease in performance of system 10.

Figure 5:
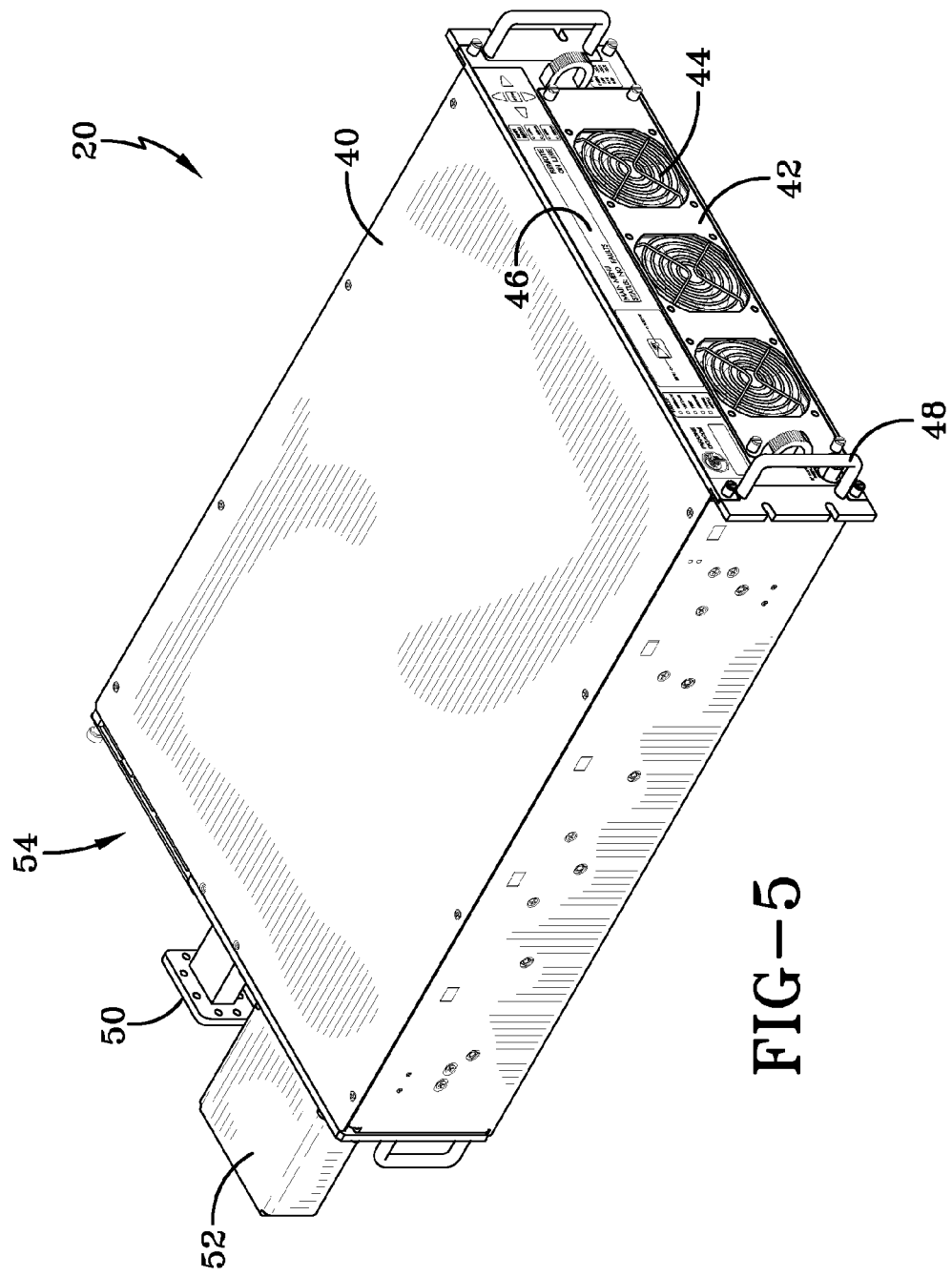
FIG. 5 illustrates a front perspective view of an exemplary solid state power amplifier chassis.

Referring to FIG. 5, a power amplifier chassis 20 includes a rectangular enclosure 40 which houses and supports the internal electronic components. A removable front panel module 42 includes fans 44 for drawing air through enclosure 40, an LED display 46 to provide, e.g., indicators of the operational status of power amplifier chassis 20, and miscellaneous hardware for removably attaching panel module 42 to enclosure 40. A pair of brackets 48 are attached to enclosure 40 at opposite sides of front panel module 42, to facilitate the removal of power amplifier chassis 20 from cabinet 12. At rear panel 54 of power amplifier chassis 20, a waveguide coupler 50 interconnects with an interface between the output of each individual power amplifier chassis 20 and waveguide combiner 16. A DC power connector 52 is also mounted on removable rear panel 54 for connecting power amplifier chassis 20 to power rail assembly 22.

Figure 6:
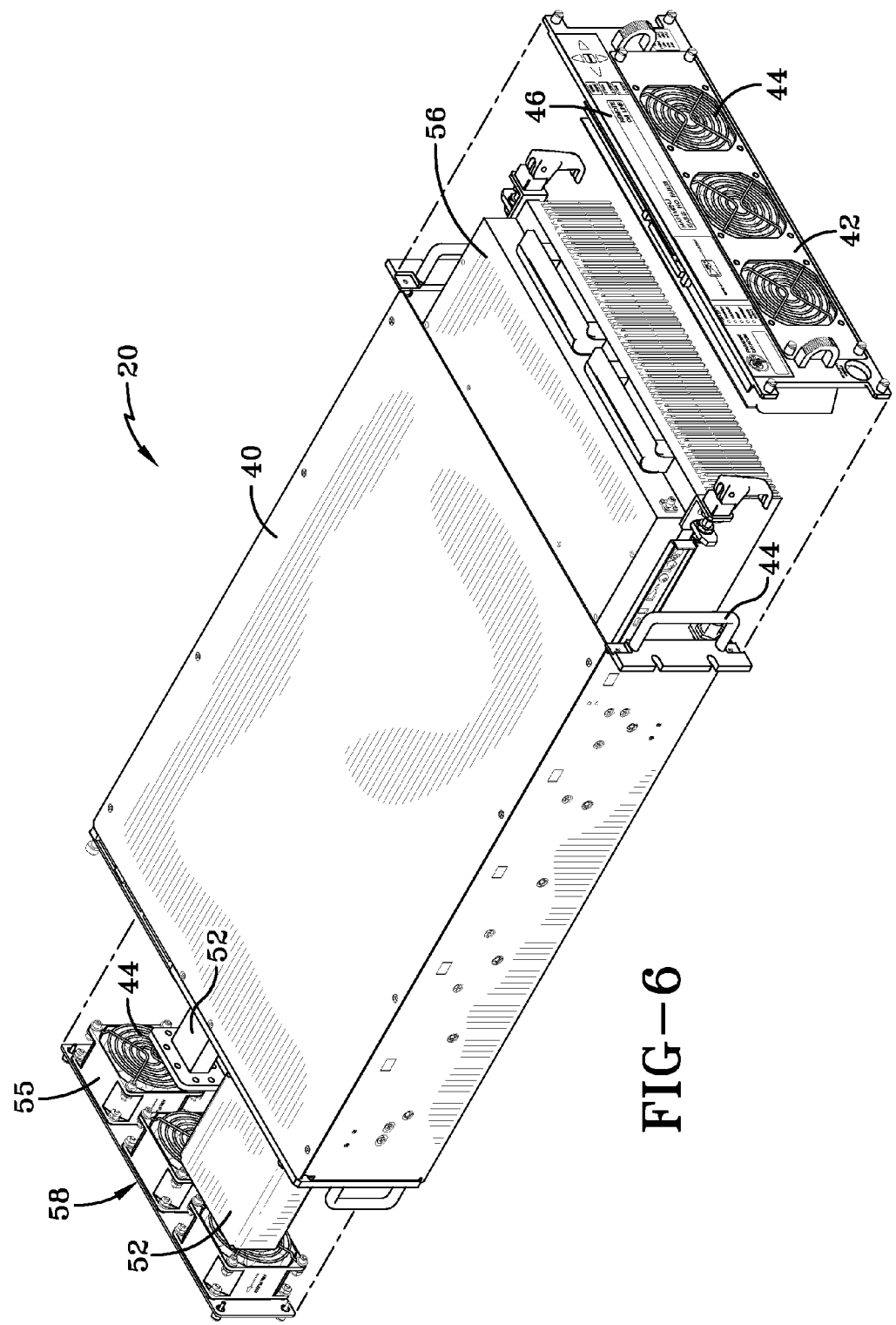
FIG. 6 illustrates an exploded view of the solid state power amplifier chassis of FIG. 5, and removable amplifiers module and fans.

Referring to FIG. 6, all subassemblies containing active components are removable from the SSPA chassis from the front panel. Active components are defined by components that consume electrical current and can be subject to wear-out and failure. The alarm circuitry within the system will notify the operator to which subassembly has faulted. These subassemblies include Front Panel Fan 44 and Fan Tray 42, Front Panel Display 46, SSPA Module 56, Rear Panel Fan 56 and Fan Tray 58, Rear Panel Embedded Controller (M & C) Card 52, and Power Supply Module 14. The system does not require to be powered off during replacement of any of the above subassemblies. The system will continue to operate normally while removing and replacing any of the above subassemblies. After replacement of any of the subassemblies and the SSPA chassis comes back online, the faulted SSPA chassis will automatically clear its previous fault condition and remove the minor alarm status report.

Figure 7:
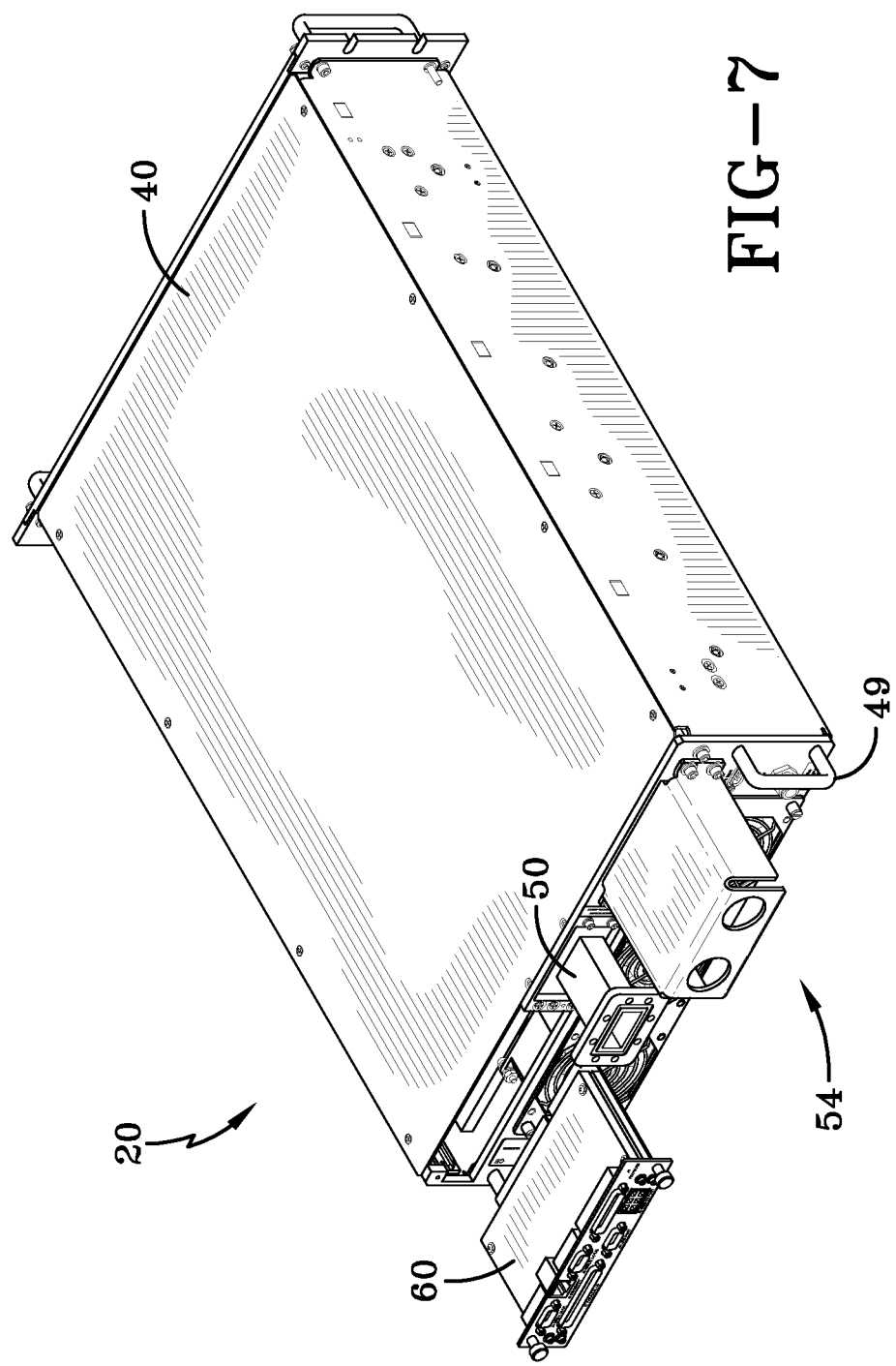
FIG. 7 illustrates a front perspective view of the solid state power amplifier chassis and removable controller module.

Further referring next to FIG. 6, an exploded view of power amplifier chassis 20 shows a solid state power amplifier (SSPA)/heatsink module 56 partially removed from housing 40. Front panel module 42 and rear fan module 55 are removable for maintenance and replacement of fans 44, and for accessing SSPA/heatsink module 56. Front and rear panel modules 42, 55 also retain SSPA/heatsink module 56 within enclosure 40 when attached thereto. A rear perspective view of power amplifier chassis 20 in FIG. 7 illustrates a removable I/O module 60 containing a control interface for connecting power amplifier chassis 20 to RF distribution panel 18. A rear bracket 49 is also provided for gripping enclosure 40.

Figure 8:
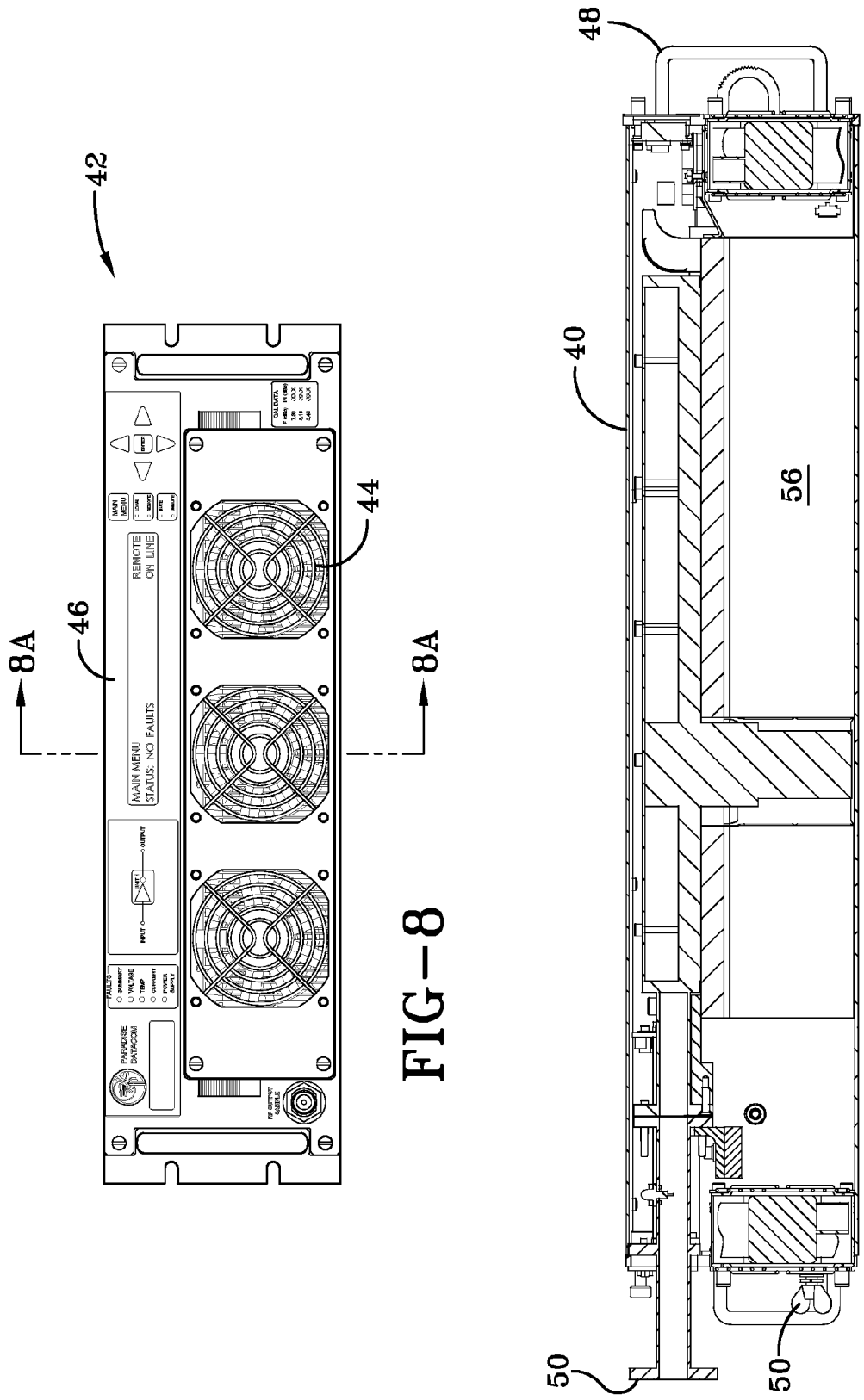
FIG. 8 illustrates an elevational front view of the solid state power amplifier chassis.

FIG. 8 shows LED display 46 and fans 44 mounted in front panel module 42. FIG. 8A is a cross-sectional view of power amplifier chassis 20 taken along the lines 8A-8A in FIG. 8. Waveguide section 50 is shown projecting rearward for attachment to waveguide combiner 16, and front and rear brackets 48, 49 for inserting and extracting enclosure 40 and SSPA/heatsink 56 to or from cabinet 12.

Referring next to FIG. 9, a schematic block diagram of system 10 shows the signal processing and electrical distribution paths for a system 10 having eight power amplifier modules 100. Each power amplifier module 100 includes a solid state power amplifier module 56 having an RF signal path input 102, a DC power input 104, a signal output path 106, and a power measurement module 120. An isolator 151 may be connected between each SSPA module 100 and the associated waveguide coupler 50. Each 4-way waveguide coupler 16 is connected with a 2-way waveguide combiner 111 such that a set of eight amplifiers chassis are combined into a single RF output port 114.

A directional waveguide coupler 112 is connected between the output of 2-way waveguide combiner 111 and RF output port 114. Directional waveguide coupler 112 provides reverse RF power 116 and forward RF power 118 samples to an RMS power measurement module 120. A forward power sample is created in RMS power measurement module 120 attached to the front panel 124 of the RF distribution box 18. RMS power measurement module 120 provides accurate measurement of the system RF output power. This RF output power reading is displayed on the master chassis display 46 and reported on the communication/alarm bus 150.

On the input side of system 10, an RF input signal is divided approximately evenly in the reverse configuration as described above with respect to the waveguide combiners 16, 111. In the RF distribution panel 18, a main RF input 126 is coupled with an eight way RF input 128 or four way RF input port 130, depending on the configuration or number of power amplifier modules 100. From there the main RF input signal 126 is split in binary fashion into four or eight inputs, i.e., an input 102 for each SSPA module 100. Splitters 111 function the same as combiners 16, 111, and are designated separately herein to differentiate splitters 111 from combiners 16, 111 in system 10 architecture. In practice, each device is equivalent, the only difference being the power level of splitters 111 are less than the power level of combiners 16, 111, and their placement in the system with respect to the processing of input and/or output signals. System links 132 134 are provided for converting system 10 from a 4-chassis system to an 8-chassis system.

As discussed above, system 10 is powered by a parallel array of AC to DC power supply modules 14. The power supply module 14 is sized such that system 10 will tolerate the failure of one power supply module with no degradation in system performance. As shown in FIG. 9, six AC to DC power supply modules 14 are connected at their outputs to a pair of parallel power busses 136. Only five of the six DC power supply modules 14 are necessary to supply power to the amplifier system. Power supply modules 14 receive AC input power from a three-phase input power source 140. It will be appreciated by those persons having skill in the art that other power supply configurations may be used, e.g., a single-phase AC input power source, or other multi-phase input AC power sources, provided that the output power of power supply modules 14 provides a DC voltage supply to the power rail 136. Power supply modules 14 may be sized to provide redundancy for the power supply, e.g., five power supply modules 14 are sufficient to carry the entire load of system 10 (or two, three or four power supply modules 14, depending on the amount of power redundancy that is desired.)

Each embedded controller 101 used in modular power amplifier system 10 includes firmware that permits an array made up of 4, 8, or 16 SSPA chassis to operate as a single chassis for purposes of normal amplifier system operation. Further, embedded controller 101 firmware design creates a hierarchy of control that allows any one of 4, 8, or 16 SSPA chassis to function as the system controller.

Figure 10:
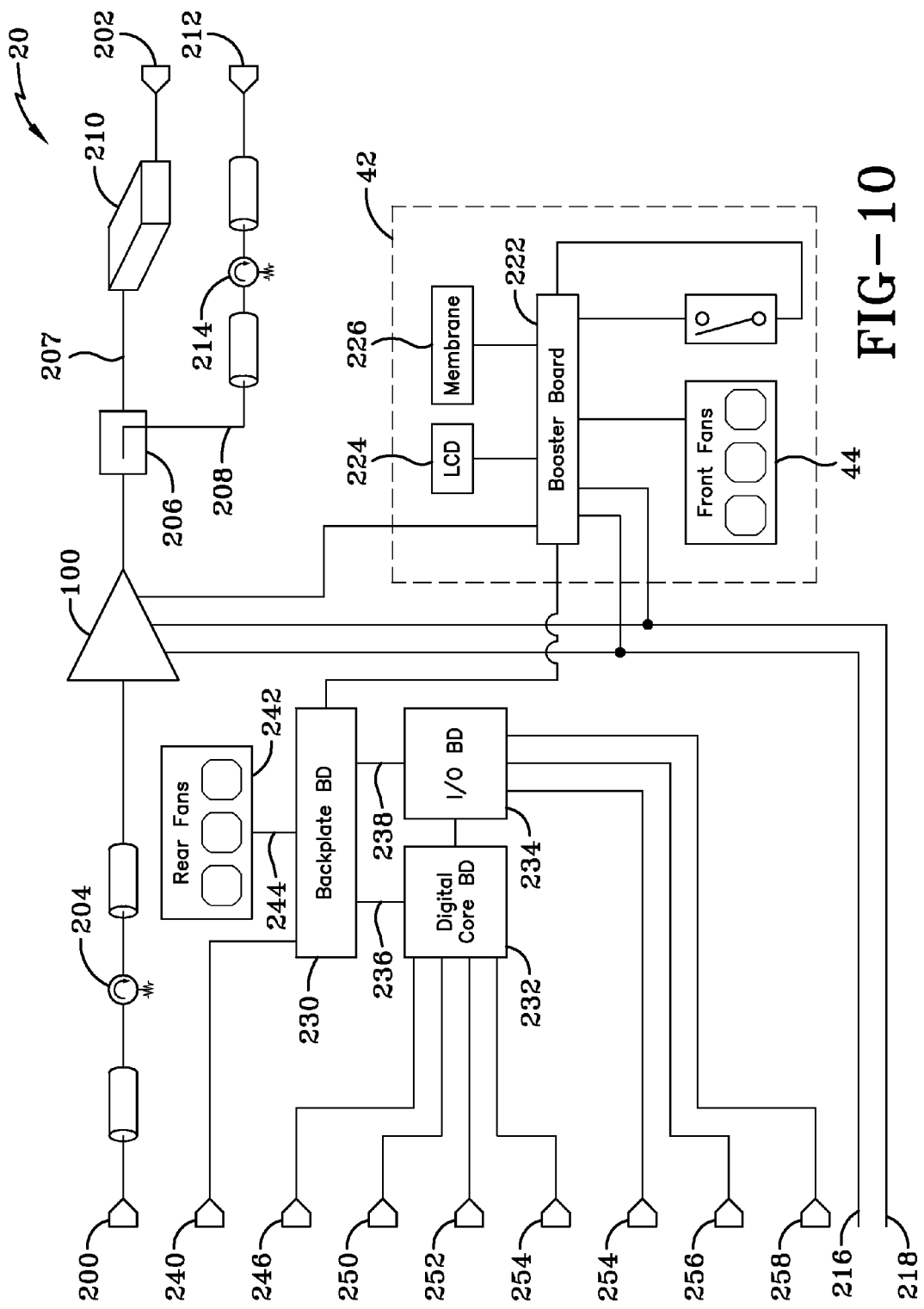
FIG. 10 is a schematic block diagram of an exemplary amplifier chassis.

Referring next to FIG. 10, an individual block diagram of an exemplary amplifier chassis 20 is shown. In each chassis 20, solid state power amplifier 100 includes input port 200 and output port 202. Input port 200 may be connected to SSPA 100 through an isolation circuit 204, or alternately, input port 200 may be directly connected SSPA 100. In one exemplary embodiment coaxial cable is used to connect input port 200 with SSPA 100. SSPA 100 transmits the amplified RF signal to a signal splitter 206 having a first output leg 207 and a second output leg 208. First output leg 207 feeds RF output 202 through a waveguide 210. Second output leg 208 feeds an RF sampling output 212 through an isolation circuit 214. RF sampling output 212 may be used, e.g., to provide RMS power measurements to RMS power measurements module 120. SSPA 100 also includes power inputs that are connected to power rail 136 via bus bars 216, 218. In the exemplary embodiment bus bar 216 provides +12VDC, and bus bar 218 is connected to a grounded bar in power rail 136.

Another input 220 to the SSPA is connected to a printed circuit board (PCB) or booster board 222 located on an interior side of front panel module 42 of chassis 20. Front panel module 42 is located adjacent to front cooling fans 44. Booster board 222 contains power and control circuitry for operation of front fans 44, e.g., booster board 222 may boost the DC bus voltage from 12 volts to 24 volts for powering front fans 44. An optional LCD display 224 may be connected to booster board 222 to indicate, e.g., fan status or other control parameters. Also, a membrane keypad 226 may be provided in electrical communication with booster board 222 for entering data and control commands.

Chassis 20 also includes a backplane PCB 230 in data communication with a microcontroller PCB 232 and an optional I/O board 234 via data busses 236, 238. Backplane PCB 230 provides circuit traces for interconnecting parallel busses that interconnect the various components to which backplane PCB 230 is connected, including microcontroller PCB 232, I/O board 234 and rear fan module 242. Backplane PCB 230 also includes a power supply connection 240. Power connection and controls provided by backplane PCB 230 through cable 244 to drive rear fans 242. Microcontroller PCB 232 includes four external inputs. Main serial port 246, serial local port 248, flash program port 250, and Ethernet port 252 provide communication links to external controllers, programming devices and data communication devices associated with microcontroller PCB 232. I/O board 238 may provide external data links through a parallel I/O port 254, link port 256, and switch port 258.

Microcontroller PCB 232 includes all of the control logic necessary for executing master control commands when chassis 20 is assigned as the master controller, and logic for monitoring operational parameters of SSPA 100 and chassis 20, e.g., for detecting when chassis 20 or SSPA 100 may be failing or about to fail, and for transferring master control to another chassis module 20 of power amplifier system 10, as discussed above with respect to embedded controller 101.

It should be understood that the application is not limited to the details or methodology set forth in the following description or illustrated in the figures. It should also be understood that the phraseology and terminology employed herein is for the purpose of description only and should not be regarded as limiting.

The construction and arrangement of the power amplifier module 20, as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. A power amplifier chassis for an n+1 redundant power amplifier system, the power amplifier chassis comprising:
   an embedded controller and a radio frequency (RF) power amplifier module for amplifying an RF signal;
   the RF power amplifier module disengageable from the power amplifier system while the power amplifier system is in operation;
   the embedded controller configured to operate the power amplifier chassis in a master controller mode or a slave controller mode;
   wherein when the power amplifier chassis is operated in the master controller mode, the embedded controller monitors at least one operating parameter associated with the power amplifier chassis, and is configured to transfer control of the power amplifier system in response to the embedded controller sensing that at least one of the monitored operating parameters indicates a failure or impending failure of the power amplifier chassis; and
   wherein when the power amplifier chassis is operated in the slave controller mode, the embedded controller is configured to receive control instructions from the master controller power amplifier module, and to reconfigure the power amplifier chassis from the slave controller mode to the master controller mode in response to a failure or imminent failure indication of a first power amplifier chassis operated in master controller mode;
   wherein the power amplifier chassis further comprises a backplane printed circuit board (PCB) in data communication with a microcontroller, the backplane comprising circuit traces for interconnecting parallel busses that electrically interconnect the backplane PCB to a microcontroller PCB, a rear fan module and a power supply connection; the microcontroller PCB further comprising control logic necessary for executing master control commands when the power amplifier chassis is assigned as the master controller of the array; and
   the microcontroller PCB further comprising logic configured to detect the power amplifier chassis or the RF power amplifier module is failing or about to fail, and to transfer control of an amplifier array to another power amplifier chassis of the amplifier array.

2. The power amplifier chassis of claim 1, wherein the embedded controller further comprises firmware, the firmware configured for controlling an array of 4, 8, or 16 power amplifiers, the array comprising at least one RF amplifier module operated in master controller mode and a plurality of RF amplifier modules operated in slave controller mode, the array configured to operate as a single chassis during system operation.

3. The power amplifier chassis of claim 1, wherein the RF power amplifier module comprises an input port and an output port, wherein at least one of the input port and the output port is connected to the RF power amplifier module through an isolation circuit.

4. The power amplifier chassis of claim 1, wherein the RF power amplifier module comprises an input port and an output port, wherein at least one of the input port and the output port is connected to the RF power amplifier module through a coaxial cable.

5. The power amplifier chassis of claim 1, wherein the RF power amplifier module further comprises a pair of power input ports and the power amplifier chassis further comprises bus bars interconnecting the power input ports to an external power supply.

6. The power amplifier chassis of claim 1, wherein the power amplifier chassis further comprises a booster board and a front panel module connected to cooling fans, and wherein the RF power amplifier module further comprises a third input connected to the booster board.

7. The power amplifier chassis of claim 1, the backplane printed circuit board further comprising an I/O board connected to backplane via data busses.

8. The power amplifier chassis of claim 1, wherein the microcontroller PCB comprising at least one of a main serial port, a serial local port, a flash program port, and an Ethernet port, for communication links between the microcontroller PCB and external devices.

9. The power amplifier chassis of claim 1, further comprising an I/O board, the I/O board comprising a parallel I/O port, a link port, and a switch port for external data links.

10. The power amplifier chassis of claim 1, the microcontroller PCB further comprising logic to monitor operational parameters of the RF power amplifier module and the power amplifier chassis.

11. The power amplifier chassis of claim 2, wherein the firmware defines a hierarchy of control that is communicated to each of the embedded controllers in the array, the firmware configured to assign at least one power amplifier chassis in the array of power amplifier chassis to function as the master controller power amplifier chassis.

12. The power amplifier chassis of claim 4, wherein the RF power amplifier module further comprises a signal splitter, a first output leg and a second output leg, wherein the RF power amplifier module transmits an amplified RF signal to the signal splitter;
   wherein the first output leg is connected to the output port through a waveguide;
   and wherein the second output leg is connected to an RF sampling port through an isolation circuit.

13. The power amplifier chassis of claim 5, wherein a first bus bar of the pair of bus bars is connected to a +12VDC external voltage source, and a second bus bar of the pair of bus bars is connected to an external grounded source.

14. The power amplifier chassis of claim 6, wherein the front panel module is adjacent to the front cooling fans, and booster board contains power and control circuitry for operation of the front cooling fans; the booster board configured to boost a DC bus voltage from 12 volts to 24 volts for powering the front fans.

15. The power amplifier chassis of claim 12, wherein the RF sampling output provides RMS power measurements to a RMS power measurements module.

16. The power amplifier chassis of claim 14, wherein the front panel module contains a LCD display connected to booster board, the LCD display configure to indicate control parameters associated with the front panel module.

17. The power amplifier chassis of claim 16, wherein the LCD display in electrical communication with the booster board for entering data and control commands.

* * * * *